United States Patent [19]
Millman et al.

[11] Patent Number: 5,390,193
[45] Date of Patent: Feb. 14, 1995

[54] TEST PATTERN GENERATION

[75] Inventors: Steven D. Millman, Mesa; James P. Garvey, Tempe, both of Ariz.

[73] Assignee: Motorola, Inc., Schaumburg, Ill.

[21] Appl. No.: 967,313

[22] Filed: Oct. 28, 1992

[51] Int. Cl.$^6$ .............................................. G06F 11/28
[52] U.S. Cl. .................................. 371/27; 364/571.04; 364/580
[58] Field of Search ............... 371/23, 27; 364/571.04, 364/580

[56] References Cited

U.S. PATENT DOCUMENTS

| | | | |
|---|---|---|---|
| 4,862,399 | 8/1989 | Freeman | 371/27 |
| 4,996,689 | 2/1991 | Samad | 371/27 |
| 5,004,978 | 4/1991 | Morris, Jr. et al. | 371/27 |
| 5,010,552 | 4/1991 | Dias et al. | 371/27 |
| 5,027,353 | 6/1991 | Jarwala et al. | 371/27 |
| 5,159,600 | 10/1992 | Chintapalli et al. | 371/27 |
| 5,187,712 | 2/1993 | Malleo-Roach et al. | 371/27 |

OTHER PUBLICATIONS

"Accurate Modeling & Simulation of Bridging Faults", S. Millman et al., Proceedings of the IEEE 1991 Custom Integrated Circuits Conference, May 1991, San Diego, Calif.

"An Accurate Bridging Fault Test Pattern Generator", S. Millman et al., Proceedings of the IEEE International Test Conference, Oct. 1991, Nashville, Tenn. pp. 1–8.

"Fault Model Evolution For Diagnosis: Accuracy vs. Precision", S. Millman et al., IEEE 1992 Custom Integrated Circuits Conference, May 1992, Boston, Mass., pp. 1–4.

Primary Examiner—Emanuel T. Voeltz
Assistant Examiner—Thomas Peeso
Attorney, Agent, or Firm—Michael D. Bingham

[57] ABSTRACT

A method for generating and simulating test patterns to detect faults (57, 63) in an integrated circuit. The method comprises identifying all nets (27) which can potentially be shorted together. Each potential fault (34, 36, 37, 38, 39) is categorized as either a feedback fault or a non-feedback fault. A test pattern is generated to detect the selected potential fault. The test pattern is simulated to determine which additional potential faults are detected by the test pattern. Potential faults which are detected by the test pattern are deleted from the fault list (12). The method is repeated until no potential faults remain on the fault list (12).

5 Claims, 3 Drawing Sheets

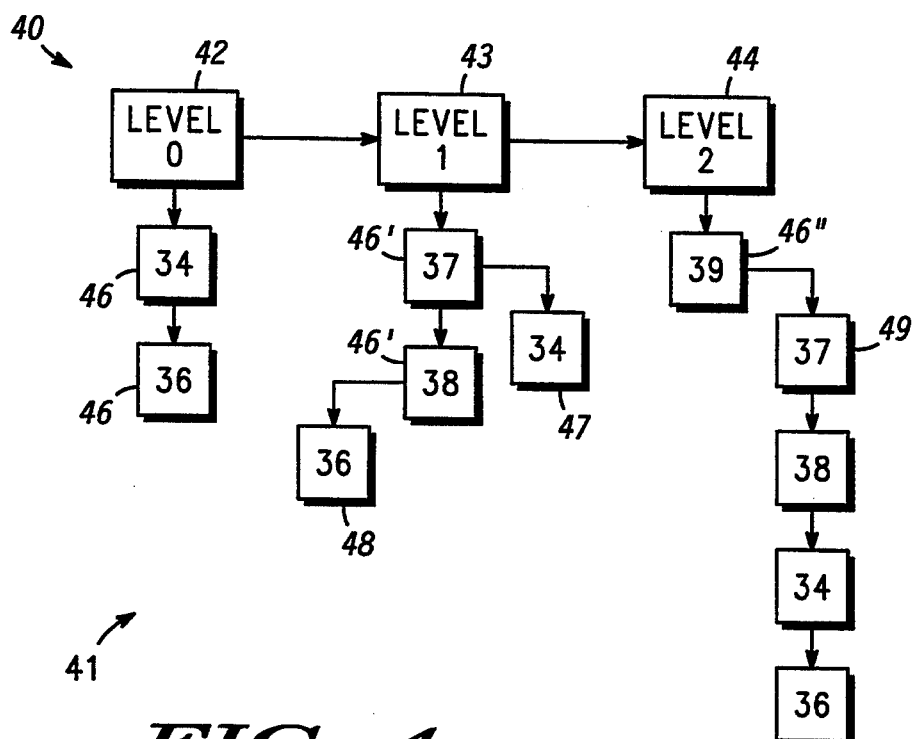
*FIG. 4*
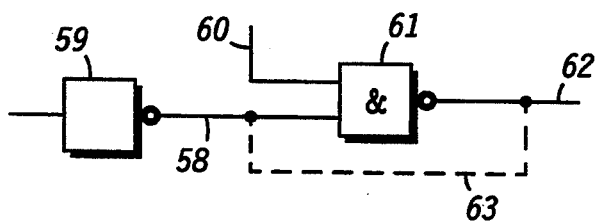
*FIG. 5*
*FIG. 6*
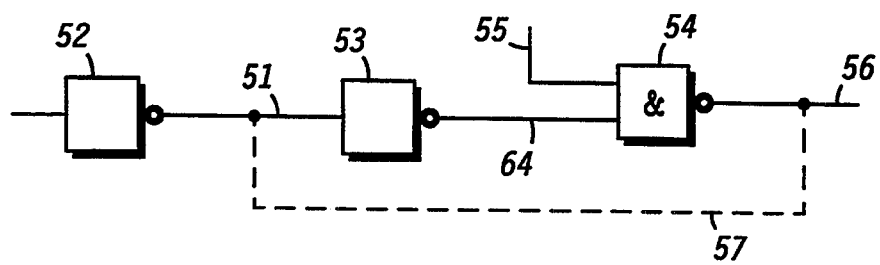

TEST PATTERN GENERATION

The present invention is related to a co-pending application Ser. No. 07/967,311 entitled "Test Pattern Fault Equivalence", filed on even date herewith, by S. Millman. This co-pending application is assigned to the same assignee as the present invention.

BACKGROUND OF THE INVENTION

The present invention relates, in general, to testing of digital circuits, and more particularly to generation of test patterns to detect bridging faults in digital circuits.

According to the prior art, three approaches are typically taken concerning the problem of bridging faults in VLSI circuits. The first approach is to ignore the bridging faults. The problem with such an approach is that bridging faults have been shown to be the most common type of failure in some technologies. In addition, as stuck-at test pattern generators become more efficient and as test vector compacting schemes reduce the number of patterns applied to the silicon the expected fault coverage of bridging faults decreases. The second approach taken for detecting bridging faults has been to use wired logic to model the failures. Such an approach involves using either wired-OR, or wired-AND, or both to model the bridging faults that can occur in the circuit. This modeling is appropriate for some technologies: shorts in ECL do behave like wired-ORs and shorts in NMOS do behave like wired-ANDs. However, in technologies such as CMOS, the wired logic model is not accurate.

The third approach, typically used for detecting bridging faults in CMOS circuits, uses a monitor on the power supply current. When shorted nodes are driven to opposite values a direct connection is present between the power and ground lines on the chip. A much larger current than the normal static current will be drawn by the chip. As a result, the only test generation requirement is to ensure that all of the nodes in the circuit are driven to opposite values at least once during the test. This method has four major drawbacks. The first is that current measurements take much more time than that required to apply a test vector and sample the outputs logically. Test equipment would have to be slowed down significantly so that the current monitors could function properly. The second drawback is that many CMOS VLSI chips do not implement pure CMOS, but may also contain circuits that dissipate static power thereby masking the fault. The third drawback is that transistors with large leakage currents may mask the effect of the bridging fault. Finally, even if the leakage currents are small, the total leakage current on a VLSI chip may be sufficient to mask the effect of a single bridging fault. As a result, these chips may have such a high normal static current that current monitoring would be impractical.

In addition, some way must be used to reduce the total nodes tested, since exhaustively testing every pair of nodes in a VLSI circuit would be uneconomically slow. According to the prior art, the physical routing of each metal line is traced to determine the nearest neighbor for each segment. Alternatively, capacitance values are calculated between adjacent and crossing lines. The lines that correspond to these capacitances are then identified as potential bridging faults. While accurate, these methods are extremely slow.

There is a need for a test pattern generator which will detect bridging faults in all technologies. The test pattern generator has to be able to function at the gate level since a lower-level simulation would be uneconomically slow. The test pattern generator must detect both faults which create a feedback loop and faults which create no feedback loop. The test patterns must not be order dependent. Finally there is a need for a method to rapidly extract nodes which could potentially short together to minimize the number of tests required.

SUMMARY OF THE INVENTION

Briefly stated, the present invention provides a method for generating and simulating test patterns to detect bridging faults in an integrated circuit. The method comprises identifying all nets which can potentially be shorted together. Categorizing each potential fault as either a feedback fault or a non-feedback fault. Generating a test pattern to detect the selected potential fault. Simulating the test pattern to determine which additional potential faults are detected by the test pattern. Deleting potential faults which are detected by the test pattern from the fault list. Repeating the steps of generating a test pattern, simulating the test pattern, and deleting potential faults from the fault list until no potential faults remain on the fault list.

BRIEF DESCRIPTION OF THE DRAWINGS

FIG. 4 shows a schematic depiction of a dependency tree structure used to identify node dependencies;

FIG. 5 shows a feedback bridging fault with an odd number of inversions; and

FIG. 6 shows a feedback bridging fault with an even number of inversions.

DETAILED DESCRIPTION OF THE DRAWINGS

A test pattern generator similar to that of the present invention is summarized in a paper "An accurate Bridging Fault Test Pattern Generator", S. Millman et al., Proceedings of the International Test Conference, October, 1991, Nashville Tenn., which is incorporated herein by reference. This paper details the background and experimental results obtained by the similar test generator. The requirements and approach used for a test generator which embodies the present invention are also summarized. For clarity, CMOS circuits are used in the examples throughout, however methods which embody the present invention are applicable to any logic technology.

A bridging fault occurs when two signal leads are unintentionally connected. Feedback bridging faults occur when the value of one of the shorted nodes can depend on the value of the other shorted node in the fault-free circuit. To detect a fault, the fault must be provoked and then an incorrect value must be propagated to a circuit output. Feedback faults that cause oscillation or state-retention problems upon the application of a vector are not considered detected by that vector. The detection of oscillation is tester and timing dependent and therefore uncertain. The method for test pattern generation of the preferred embodiment produces test patterns that do not cause oscillation or state retention problems. Therefore, a re-ordering of the test patterns will not change the predicted fault coverage.

Figure 1:
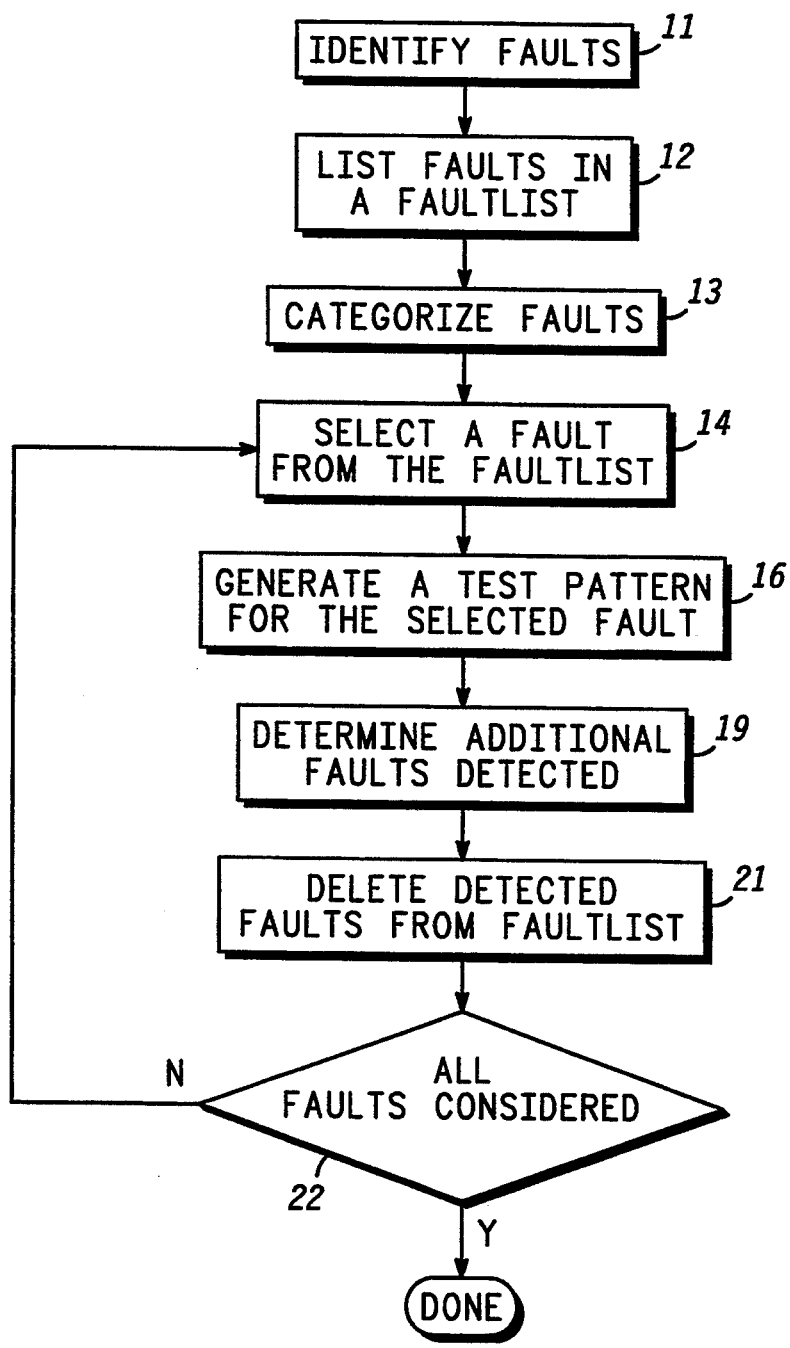
FIG. 1 shows a flowchart depicting a method for generating test patterns as a preferred embodiment in accordance with the present invention.

FIG. 1 shows a flowchart depicting a method for generating and simulating test patterns to detect bridging faults in an integrated circuit as a preferred embodiment in accordance with the present invention. An identification step 11 tests each pair of nets in the design to determine if they could be shorted together. A fault list 12 is created which lists each potential bridging fault in a list for further processing. Every potential bridging fault on fault list 12 is categorized in a categorization step 13 as either a feedback or a non-feedback bridging fault. If the fault could produce a feedback loop, then the bridging fault is categorized as a feedback bridging fault. A bridging fault is selected from the fault list by a selection step 14. A test pattern 16 is generated to detect that bridging fault. For detectable faults, a determination step 19 performs simulations to determine which additional potential faults from fault list 12 are detected by the test pattern. Potential faults which are detected by the test pattern are deleted from fault list 12 by a deletion step 21. The steps of selecting a bridging fault 14, generating a test pattern 16, determination step 19, and deletion 21 are repeated until no potential faults remain on fault list 12. At this stage, all potential faults have been considered 22 for test pattern generation.

Figure 2:
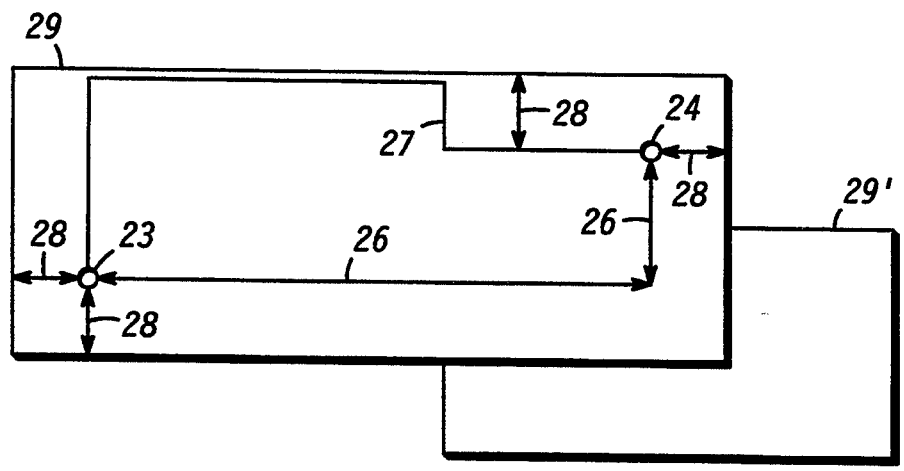
FIG. 2 shows a maximum extent rectangle for a typical pair of nodes connected by a wire.

FIG. 2 shows a maximum extent rectangle 29 constructed for a typical pair of nodes connected by a wire. In the preferred embodiment, maximum extent rectangle 29 is used to determine the area within which a net could be shorted to another net. A first pin 23 is located at $x1,y1$ and a second pin 24 is located at $x2,y2$. First pin 23 typically corresponds to the output of a gate and second pin 24 typically corresponds to the input of a different gate. In this example, $x1 \leq x2$ and $y1 \leq y2$. In a design where manhattan geometry is required (i.e. interconnect is restricted to moving right, left, up, or down), a minimum manhattan distance 26 from $x1, y1$ to $x2, y2$ is $(x2-x1)+(y2-y1)$. An actual wire route 27 between first pin 23 and second pin 24 has a length L. That means that the manhattan distance left over, that is the extra length that would allow the line to take a non minimum path between the points, is $L-(x2-x1)-(y2-y1)$. For non-manhattan geometry, the extra length would be $L-\sqrt{(x2-x1)^2+(y2-y1)^2}$.

The maximum distance actual wire route 27 can go above y2 is equal to half the extra length computed above, since however far above y2 it goes it must come back down. Thus an excess wire length 28 (EWL) is equal to:

$$EWL = \frac{L - (x2 - x1) - (y2 - y1)}{2}.$$

Excess wire length 28 defines a maximum extent rectangle 29 which is the maximum range that the wire can take in its path from $x1,y1$ to $x2,y2$. Maximum extent rectangle 29 extends beyond both first pin 23 and second pin 24 by excess wire length 28. A plurality of maximum extent rectangles 29' are computed for all of the wires in a circuit, wires that could short to actual wire route 27 will have maximum extent rectangles 29' which overlap maximum extent rectangle 29. Some wires which could not cause a short to actual wire route 27 will also have maximum extent rectangles 29' which overlap maximum extent rectangle 29 and hence will be identified as potential bridging faults. However, the extra potential bridging faults are much fewer than the total node pairs in a typical VLSI circuit and the speed of the search compensates for the extraneous potential bridging faults identified. Conversely, if the boxes corresponding to two wires do not overlap then those two wires can not result in a bridging fault.

In the more general case of any $x1,y1$ and $x2,y2$, the bounds of maximum extent rectangle 29 are computed as follows:

$$TOP = \max(y1,y2) + [L - |x2-x1| - |y2-y1|]/2.$$

$$BOTTOM = \min(y1,y2) - [L - |x2-x1| - |y2-y1|]/2.$$

$$RIGHT = \max(x1,x2) + [L - |x2-x1| - |y2-y1|]/2.$$

$$LEFT = \min(x1,x2) - [L - |x2-x1| - |y2-y1|]/2.$$

The method proceeds as follows:

(1) For each wire that could short to another wire and for each fanout point to which the wire goes:
  (i) Calculate $[L - |x2-x1| - |y2-y1|]/2$.
  (ii) Calculate maximum extent rectangle 29 for the wire (2) Determine which maximum extent rectangles 29 overlap by moving through the list of gates comparing maximum extent rectangle 29' for the gate in question with the maximum extent rectangles 29 of gates that appear later in the list. Those maximum extent rectangles 29' which overlap correspond to potential bridging faults.

Each step can be performed in a single pass through the list of gates, requiring a total of two passes. Duplicate entries will be avoided since each pair of boxes is only compared once.

Figure 3:
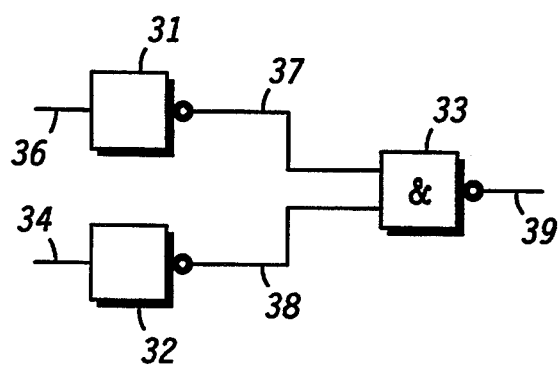
FIG. 3 shows a schematic diagram of a typical circuit.

FIG. 3 shows a schematic diagram of a typical circuit. A first inverter gate 31 has an input node 36. A second inverter gate 32 is coupled to an input node 34. A node 37 couples the output of first inverter gate 31 to an input of a NAND gate 33. Second inverter gate 32 is coupled to a second input of NAND gate 33 by a node 38. A node 39 couples the output of NAND gate 33 to external circuitry.

FIG. 4 shows a dependency tree 41 comprising a first linked list 40 wherein each item within first linked list 40 points to a subsidiary linked list 46. A level zero item 42, a level one item 39, and a level two item 41 point to a subsidiary linked list 46, 46' and 46" respectively. The contents of subsidiary linked lists 46, 46' and 46" comprise identification of nodes in the design that are at the same level. Creation of subsidiary linked lists 46, 46' and 46" comprises four steps. For step one, a level is assigned to each gate output node. Primary input nodes, that is external inputs to the circuit, are assigned a level of zero. All gate output nodes are assigned a level equal to one more than the maximum of the levels of the gate's input nodes. Thus the level of a gate output node corresponds to the maximum number of intervening gates between the gate output node and a primary input. Accordingly input node 36 and input node 34 are assigned a level of 0. Node 37 and node 38 are assigned a level of 1. Node 39 is assigned a level of 2. Step two, identifying codes for each node are placed in the appropriate list according to level. For clarity the identifying code used corresponds to the item number designating that node in FIG. 3. Accordingly, codes identifying input node 34 and input node 36, the level zero nodes, are placed in subsidiary linked list 46. Codes identifying node 37 and node 38, the level one nodes, are placed in subsidiary linked list 46'. A code identifying node 39, the only level two node in this example, is placed in subsidiary linked list 46''. Step three, starting with the lowest level, for each gate output node in the level place the gate's input nodes in that gate's dependency list, as well as the dependency lists of those input nodes. Thus the dependency list of all gates driving a gate's inputs are also placed onto the gate output node's dependency list. Reconvergent fanout could cause duplicate entries in the list, but such redundant entries are identified and ignored. Accordingly, codes identifying input node 34 and input node 36, the level zero nodes, are placed in a dependency list 47 and a dependency list 48 respectively. Codes identifying node 37 and node 38, the level one nodes, are placed in a dependency list 49. Finally, codes identifying input node 34 and input node 36, the level zero nodes, are also placed in dependency list 49. Step four, for each of the potential bridging faults in fault list 12 (FIG. 1), look at the dependency list for the gate output node with the higher level. If the lower level gate output node is found on the dependency list then the fault is a feedback bridging fault. Conversely, if the lower level gate output node is not found on the dependency list then the potential bridging fault is a non-feedback fault. For example, node 37 shorted to node 39 is a feedback fault since node 37 is on dependency list 49. However, node 37 shorted to node 38 is a non-feedback fault since node 37 is not found on dependency list 48.

Steps one through three identify the dependencies, while step four determines if a certain dependency is present. Step one is required for a test pattern generator, so no extra computation is required for dependency identification. Steps two and three each require one pass through the circuit. Step four is efficient since the dependency list on each gate can be ordered, which results in fast searches. In addition, as dependencies are found, the node's entry in the dependency list can be removed so that the next search is even faster.

For a potential bridging fault which is identified as a non-feedback bridging fault a test pattern is generated to test for the potential bridging fault by producing conflicting logic states on the two outputs. A well known voting model is used to evaluate the output logic state which results from conflict between the two gate outputs. The voting model examines the internal drive capability of each gate together with the output state of that gate to determine the resultant output logic state. The resultant output logic state is allowed to propagate through the circuit to an output pin where it is sensed by an external tester. A fault simulation is performed to identify additional faults which are detected by this test pattern, and all faults which are detected are deleted from fault list 12 (FIG. 1).

FIG. 5 shows a feedback bridging fault with an odd number of inversions. The circuits shown in FIGS. 5 and 6 are illustrative of the two classes of bridging faults which induce feedback. For clarity only a simple circuit is shown. However, the method of the preferred embodiment will detect faults which may utilize any number of gates or different gate types to provide the required number of inversions. A gate 59 is coupled to a NAND gate 61 by a node 58. NAND gate 61 has a second input node 60. An output node 62 is coupled to node 58 by a bridging fault 63. Bridging fault 63 thus creates a feedback path having an odd number of inversions. In this example gate 59 is often called the "rear gate" and NAND gate 61 is often called the "front gate". The designation of "front gate" and "rear gate" indicates the order in which a propagating logic state will encounter the two gates.

To test for bridging fault 63 a test vector is generated which causes opposite states to be present on node 62 and node 58. Heuristics are used to determine the preferred states for node 62 and node 58. The heuristics are used to increase the likelihood that a test pattern will be generated that will detect the fault. A voting model is then used to determine whether gate 59 or NAND gate 61 will control the state of output node 62. If NAND gate 61 controls the state of output node 62 then the fault-free value from gate 61 is forced onto node 58 by the test pattern generator. A fault-free simulation propagates the effect of this state through the circuit to node 62. If node 62 changes state then the path from node 58 to node 62 is sensitized and must have an odd number of inversions. In this case bridging fault 63 is undetectable using this test pattern because oscillations may occur. Alternative test patterns are typically attempted, for example using a stronger logic state for node 58 or reversing the fault-free state applied to node 58 and node 62. If a satisfactory test pattern can not be found then bridging fault 63 is marked as undetectable.

If node 62 does not change state then either the feedback path has an even number of inversions, requiring another procedure, or the path from node 58 to node 62 is not sensitized by this test pattern. For example the path is desensitized when other logic within the circuit forces node 60 to a zero state, forcing NAND gate 61 to output a one state regardless of the state of node 58. The voting model is used for a further check to verify that gate 61 continues to control the state of output node 62 with the test pattern applied. If the feedback path is desensitized and the vote is maintained, then bridging fault 63 is detected provided the faulty value on node 58 propagates to an output without passing through node 62.

Alternatively gate 59 controls the state of output node 62 and the fault is unconditionally detected. The faulty circuit could produce a latch circuit if the path from node 58 to node 62 is sensitized. In this case, a previous vector could establish a latched state in this otherwise combinatorial portion of the circuit such that gate 59 is unable to control the state of output node 62. This situation will still be detected since the state on node 58 will propagate to gate 61 producing a change of state on output node 62. At this point both gates output the same state and the effects of any latch mechanism are cleared and the fault is detected.

FIG. 6 shows a feedback bridging fault with an even number of inversions. A gate 52 is coupled to an inverting gate 53 by a node 51. Gate 53 in turn is coupled to a NAND gate 54 by a node 64. NAND gate 54 has a second input node 55. In this example gate 52 is often called the "rear gate" and NAND gate 54 is often called the "front gate". An output node 56 is coupled to node 51 by a bridging fault 57. Bridging fault 57 thus creates a feedback path having an even number of inversions. The path from node 51 to output node 56 cannot be sensitized in the fault-free circuit since the fault will be identified for simulation only if node 51 and output node 56 are at opposite fault-free states. Since the fault is an even feedback fault, if the path were sensitized the nodes would have the same value. For example the path is desensitized when other logic within the circuit forces node 55 to a zero state, forcing NAND gate 54 to output a one state regardless of the state of node 64. To test for bridging fault 57, the voting model is used to determine whether gate 52 or NAND gate 54 will control the state of output node 56. In either case, a previous vector could establish a latched state in this otherwise combinatorial portion of the circuit. If gate 52 controls the state of output node 56, then the fault-free state from node 56 is forced onto node 51 by the test pattern generator. A fault-free simulation propagates this state through the circuit to the level of NAND gate 54. The voting model is again used to determine whether gate 52 or NAND gate 54 will control the state of output node 56. If gate 52 still controls the state of output node 56 then bridging fault 57 is detected. If NAND gate 54 controls the state of output node 56, then the test may be invalidated. The test is invalidated if the faulty value on node 51 propagates to node 64 and weakens gate 54 such that gate 52 outvotes gate 54. In order for the fault to be detected, the faulty value on node 51 must be propagated to a primary output. The strength of gate 54 can be compared to the strength of gate 52 after this required fault simulation is completed. Hence, no extra simulation is required. If gate 54 is still stronger than gate 52 the bridging fault is detected.

For illustration a preferred method is described using a pseudo-code to illustrate the function of each step:

```
perform a strength check to determine the strong node
determine if a feedback fault path is sensitized
if rear_node is strong then
    if sensitized then detected {odd}
    else check_strength
        if rear_node is {still} strong then detected
        endif
    endif
else {front_strong}
    if sensitized then not_detected {oscillation/odd}
    else check_strength
        if front_node is {still} strong then
            detected
        endif
    endif
endif
end
```

In accordance with methods well known in the art, braces "{" and "}" enclose comments, and indentation emphasizes containment within an "if"-"endif" structure.

The preferred embodiment provides a method for detecting bridging faults without explicitly determining whether the potential feedback path has an even or odd number of inversions. This is significant since explicit determination of the number of inversions between nodes is often difficult and can change from test pattern to test pattern.

By now it should be clear that the present invention provides a test pattern generator which will detect bridging faults in all technologies. The test pattern generator functions at the gate level without requiring time consuming circuit-level simulation. The method provides a simple way to determine whether or not a potential bridging fault could introduce a feedback loop. The test pattern generator detects both faults which create a feedback loop and faults which create no feedback loop. A single test pattern is used for each test so the test patterns are not order dependent. Finally there is provided a method to rapidly extract nodes that could potentially short together to minimize the number of tests required.

I claim:

1. A method for generating and simulating test patterns to detect faults in an integrated circuit, comprising:

identifying a plurality of nets which can potentially be shorted together as a plurality of potential faults;
   listing each potential fault in a fault list;
   categorizing each of the plurality of potential faults into either a feedback fault or a non-feedback fault wherein categorizing each of the plurality of potential faults into either a feedback fault or a non-feedback fault includes:
   assigning a level to a gate output node equal to the greatest number of intervening gates between the gate output node and a primary input;
   placing an identification code for each gate output node in a linked list which corresponds to the level of the gate output node;
   building a dependency list for each gate output node comprising the identification codes for each node on a path between the gate's output node and a primary input;
   recursively adding the dependency list for each gate which drives an input node to the gate until all dependencies are included;
   selecting a potential fault from the fault list;
   inspecting the nodes to determine a high level faulty node and a low level faulty node from the nodes which comprises the potential fault; and
   inspecting the dependency list associated with the high level faulty node to determine if the potential fault creates a feedback fault;
   selecting one potential fault from the fault list, having a first faulty node and a second faulty node;
   generating a test pattern to detect the selected potential fault; and
   checking the test pattern to ensure that the selected potential fault is detected even if the potential fault is categorized as a feedback fault.

2. The method for generating and simulating test patterns to detect faults in an integrated circuit according to claim 1, further comprising:

implicitly determining the potential feedback fault category as either potential odd inversion feedback faults or potential even inversion feedback faults;
   testing each potential odd inversion feedback fault for oscillation; and
   testing each potential even inversion feedback fault for a latch state.

3. The method for generating and simulating test patterns to detect faults in an integrated circuit according to claim 1, wherein identifying a plurality of nets which can potentially be shorted together as a plurality of potential faults comprises:

providing a plurality of nets each net having a plurality of destinations having a predetermined minimum routing distance and a predetermined actual routing distance;
   forming a list comprising the plurality of nets;
   selecting one net from the list;
   removing the selected net from the list;
   computing an excess wire length for the selected net based on the difference between the predetermined minimum routing distance and the predetermined actual routing distance of the selected net;

determining the maximum excursion of the wire routing to obtain a bounding distance;

forming a rectilinear bounding box including each destination for the selected net and extending at least the bounding distance beyond any destination; and identifying all nets which intersect the rectilinear bounding box as nets which can potentially be shorted to the selected net.

4. The method for generating and simulating test patterns to detect faults in an integrated circuit according to claim 1, wherein identifying a plurality of nets which can potentially be shorted together as a plurality of potential faults comprises:

providing a plurality of nets each net having a plurality of destinations and a predetermined physical routing distance;

computing an excess wire length for each net based on the physical routing distance of the net;

dividing the excess wire length by two to obtain a bounding distance for the net;

forming a rectilinear bounding box which includes each destination for each net and extends at least the bounding distance beyond any destination;

listing each rectilinear bounding box; and identifying the pair of nets associated with each intersecting bounding box as two nets which can potentially be shorted together.

5. A method for categorizing faults in an integrated circuit comprising:

assigning a level to a gate output node equal to the greatest number of intervening gates between the gate output node and a primary input;

placing an identification code for each gate output node in a linked list which corresponds to the level of the gate output node;

building a dependency list for each gate output node comprising the identification codes for each node on a path between the gate's output node and a primary input;

selecting a potential fault from a fault list;

inspecting the nodes which comprise the potential fault to determine a high level faulty node and a low level faulty node from the nodes which comprises the potential fault; and inspecting the dependency list associated with the high level faulty node to determine if the potential fault creates a feedback fault.

* * * * *